(12) United States Patent
Zhang et al.

(10) Patent No.: US 9,680,484 B2
(45) Date of Patent: Jun. 13, 2017

(54) CLOCK CONDITIONER CIRCUITRY WITH IMPROVED HOLDOVER EXIT TRANSIENT PERFORMANCE

(71) Applicant: Texas Instruments Incorporated, Dallas, TX (US)

(72) Inventors: Benyong Zhang, Auburn, WA (US); Anjin Du, Beijing (CN); Junqiang Shi, Shenzhen (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/956,667

(22) Filed: Dec. 2, 2015

(65) Prior Publication Data

US 2016/0164532 A1 Jun. 9, 2016

Related U.S. Application Data

(60) Provisional application No. 62/088,296, filed on Dec. 5, 2014.

(51) Int. Cl.
| | |
|---|---|
| *H03L 7/00* | (2006.01) |
| *H03L 7/095* | (2006.01) |
| *G06F 1/04* | (2006.01) |
| *G06F 1/12* | (2006.01) |
| *H03L 7/14* | (2006.01) |
| *H03L 7/183* | (2006.01) |

(52) U.S. Cl.
CPC ............... *H03L 7/095* (2013.01); *G06F 1/04* (2013.01); *G06F 1/12* (2013.01); *H03L 7/143* (2013.01); *H03L 7/146* (2013.01); *H03L 7/183* (2013.01)

(58) Field of Classification Search
CPC ...................................................... H03L 7/103
See application file for complete search history.

(56) References Cited

U.S. PATENT DOCUMENTS 5,754,607 A * 5/1998 Powell ................... H03L 7/093
327/156

\* cited by examiner

*Primary Examiner* — Daniel Puentes
(74) *Attorney, Agent, or Firm* — Andrew Viger; Charles A. Brill; Frank D. Cimino

(57) ABSTRACT

Disclosed is a circuit, such as a clock conditioner, that provides an improved ability to exit from holdover operations, most notably during conditions where the clock signal inputs to a PLL of the clock conditioner are significantly out of phase. The circuit utilizes the PLL to generate output clocks based on a reference clock and a feedback clock. During holdover mode, the PLL is unlocked. When the reference clock becomes available and holdover mode can be exited, a holdover controller issues a reset signal that triggers a synchronization of the phases of the inputs to the PLL. The reset signal causes the feedback divider component that generates the feedback clock input to reset its phase and adjust its divide ratio for at least the first divide cycle after restart so that its next rising edge will be phase-aligned with the reference clock. Once the two inputs of the PLL phase detector are phase-aligned, the PLL is re-enabled and the PLL smoothly resumes normal operation.

17 Claims, 5 Drawing Sheets

CLOCK CONDITIONER CIRCUITRY WITH IMPROVED HOLDOVER EXIT TRANSIENT PERFORMANCE

CROSS-REFERENCE TO RELATED APPLICATIONS

The present application claims the benefit of the filing date of Provisional Application No. 62/088,296, filed Dec. 5, 2014.

TECHNICAL FIELD

The recited claims are directed, in general, to circuits for generating clock signals and, more specifically, to circuits for clock conditioning, including clock jitter cleaning.

BACKGROUND

A clock conditioner is typically used to generate desired output clock frequencies with low jitter and low phase noise based on an input reference clock. Typical clock conditioners generate an output clock by phase-locking the output of a voltage controlled oscillator (VCO) or a voltage controlled crystal oscillator (VCXO) to an input reference clock using a phase-locked loop (PLL). The input clock may be a clock signal generated by another component, or it may be a clock that is recovered from a received digital signal.

In order to improve system-level reliability, two or more clocks signals may be provided as inputs to a clock conditioner. One of these input clocks is selected as the PLL reference clock input. If the selected input clock fails or otherwise becomes unusable, the next available input clock may be selected and used as the new PLL reference clock input. This is commonly referred to as input clock switching. If all available input clocks fail or are otherwise unusable, the clock conditioner must still generate a reasonably accurate output clock for a certain amount of time. In this case, the clock conditioner is said to operate in holdover mode. Different systems may require a clock conditioner to operate in holdover mode for different amounts of time.

When a clock conditioner is operating in holdover mode and an input clock signal becomes available that is suitable to use as the PLL reference clock input, the clock conditioner exits holdover mode and resumes normal operations mode. This transition from holdover mode to normal operation mode must be completed as quickly and seamlessly as possible. When transitioning from holdover mode to normal operations mode, it is desirable, or required by some systems, to minimize the impact of this transition on the frequency and phase of the output clocks being generated as outputs by the clock conditioner.

One potential issue that may cause problematic disturbances during the exit-holdover transition is significant phase differences in the counter inputs to the phase detector of a PLL. In a clock conditioner, the inputs to the phase detector of the PLL are an input counter that is driven by a reference clock input and a feedback counter that is driven by a feedback clock generated as an output of the PLL. In the worst case, the phase difference in the inputs to the PLL phase detector can be as large as 180 degrees, since there is no deterministic phase relationship between the outputs to the two counters. Such large phase difference can cause significant disturbances in the operation of PLL, such as delays in the time required for the PLL to relock to the reference clock, delays in completing the exit-holdover transition, and/or transient frequency/phase errors in the output clocks.

Certain conventional clock conditioners avoid these problems caused by a significant phase difference in the inputs to the phase detector by waiting to exit holdover mode until the phase detector inputs, the input counter and the feedback counter, are phase-aligned. This conventional technique can be used to reduce transient frequency/phase errors in the output clock when exiting holdover. However, one drawback of this conventional technique is that the wait time for the phase detector inputs to align is uncertain and may be too long for certain conditions. For example, if the phase error between the input counter and feedback counter is 180 degrees and the frequency error between these signals is relatively small, the rate of change of the phase difference during the alignment of the two input signals may be very slow. In this case, it may take prohibitively long to wait for the phase alignment of the input counter and the feedback counter inputs to the phase detector. This delay in alignment of the phase detector inputs may prevent the clock conditioner from exiting holdover mode in some cases, as discussed in more detail below. Additionally, the uncertainty in the duration of this alignment delay results in the clock conditioner behaving unpredictably during the holdover transition thus may fail to meet requirements of some systems.

Accordingly there is a need for an improved clock conditioner capable of quickly and seamlessly exiting holdover mode and further capable of executing the holdover transition in a manner that minimizes problematic disturbances caused by uncertain phase differences in the inputs to the clock conditioner PLL.

SUMMARY OF THE INVENTION

According to one aspect of the invention, the disclosure herein includes a timing circuit and associated method comprising: a first divider operable for generating a first input signal based on a feedback signal generated by an oscillator, a second divider operable for generating a second input signal based on a reference clock signal; a PLL operable for generating a control signal for configuring an oscillator to generate a clock signal, wherein the frequency of the clock signal matches the frequency of the second input signal, and wherein the PLL generates the control signal based on the first input signal and the second input signal; and a holdover controller operable for issuing a reset signal to the first divider, wherein the reset signal synchronizes the phase of the first input signal and the second input signal.

According to another aspect of the invention, the timing circuit further comprises a digital lock detector operable to detect holdover exit conditions based on the first input signal and the second input signal. According to another aspect of the invention, the digital lock detector is further operable to detect holdover exit conditions based on a cycle of frequency comparisons between the first inputs signal and the second input signal. According to another aspect of the invention, the holdover controller is further operable to issue the reset signal concurrent with the initiation of a frequency comparison cycle by the DLD. According to another aspect of the invention, the timing circuit further comprises a flip-flop operable to sample the reset signal. According to another aspect of the invention, the flip-flop is further operable to sample the reset signal synchronously with the second input signal. According to another aspect of the invention, the holdover controller is further operable to initiate a frequency comparison cycle by the DLD based on validation of the reference clock signal. According to another aspect of the invention, the timing circuit further comprises a digital to analog converter operable for generating a holdover control signal, wherein the holdover control signal is generated based on a digital code provided by the holdover controller.

According to another aspect of the invention, the disclosure herein includes a clock conditioner comprising an oscillator operable for generating a conditioned clock signal based on a control signal and further operable for generating a feedback clock signal, wherein the control signal is generated based on a reference clock signal; and a controller operable for initiating a holdover condition based on a loss of the reference clock signal and further operable to exit a holdover condition by issuing a reset signal that synchronizes the phases of the feedback clock signal with the reference clock signal.

According to another aspect of the invention, the controller is further operable to signal the replacement of the control signal with a holdover control signal upon initiating a holdover condition. According to another aspect of the invention, the clock conditioner further comprises a digital lock detector (DLD) operable to detect holdover exit conditions based on the feedback clock signal and the reference clock signal. According to another aspect of the invention, the controller is further operable to initiate a frequency comparison cycle by the DLD based on validation of the reference clock signal. According to another aspect of the invention, the controller is further operable to issue the reset signal concurrent with the initiation of a lock detection cycle.

BRIEF DESCRIPTION OF THE DRAWINGS

Figure 1:
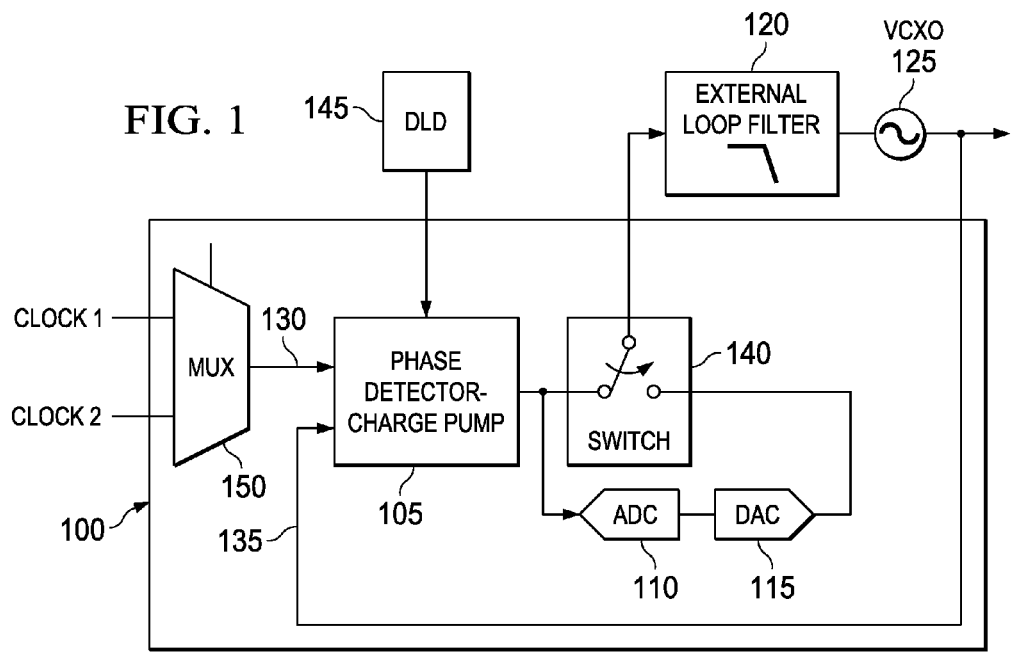

Having thus described the invention in general terms, reference will now be made to the accompanying drawings, wherein:

FIG. 1 is schematic block diagram of a conventional clock conditioner circuit that implements a holdover function.

Figure 2:
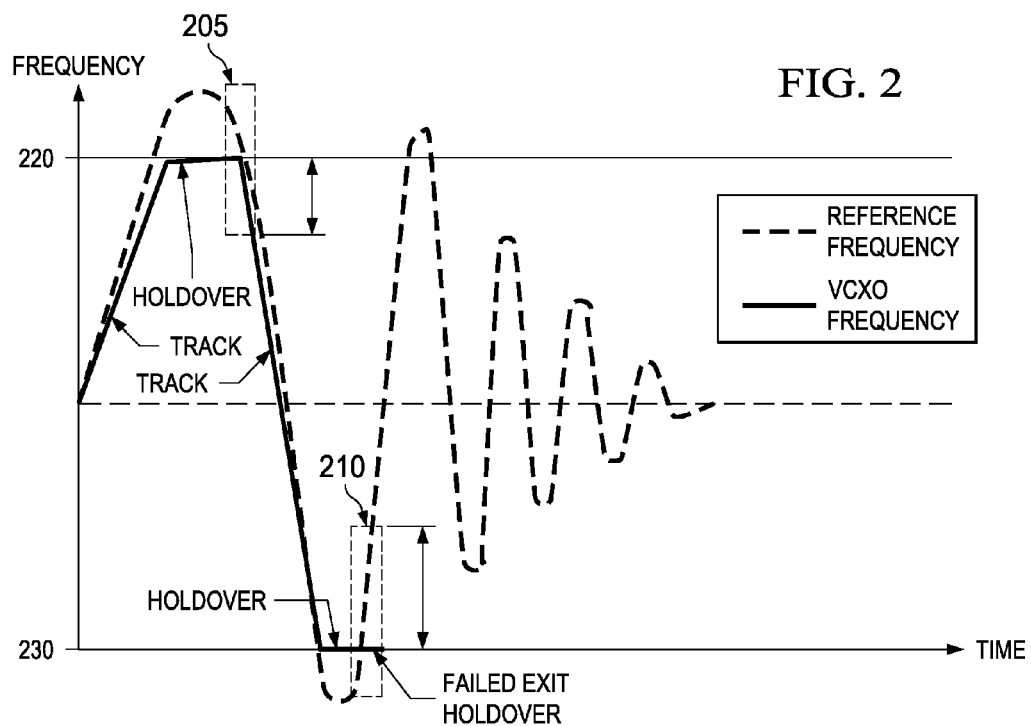

FIG. 2 illustrates a conventional clock conditioner scenario where delay in exiting holdover prevents the holdover transition.

Figure 3:
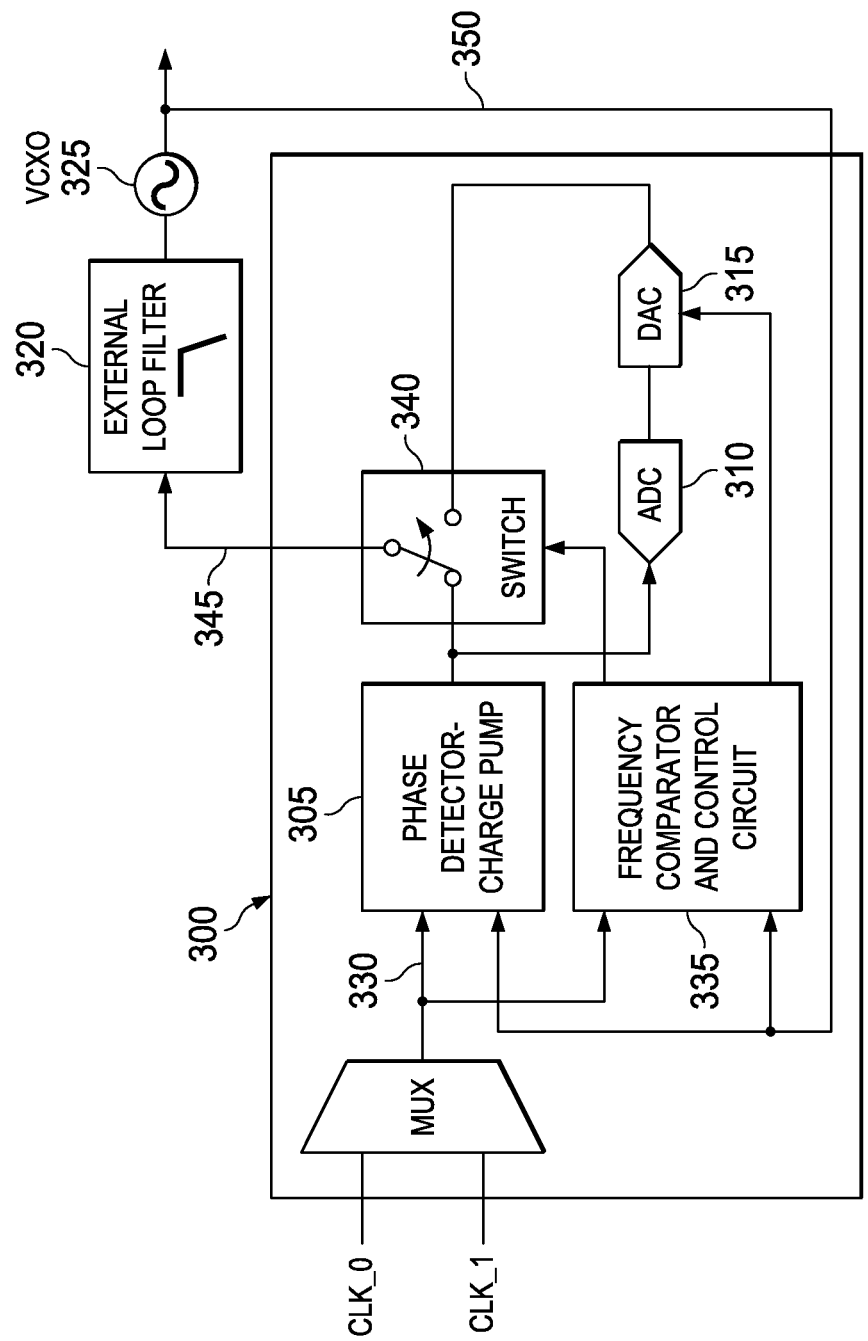

FIG. 3 is a schematic diagram depicting certain components of a timing circuit for a clock conditioner according to one aspect of the Application.

Figure 4:
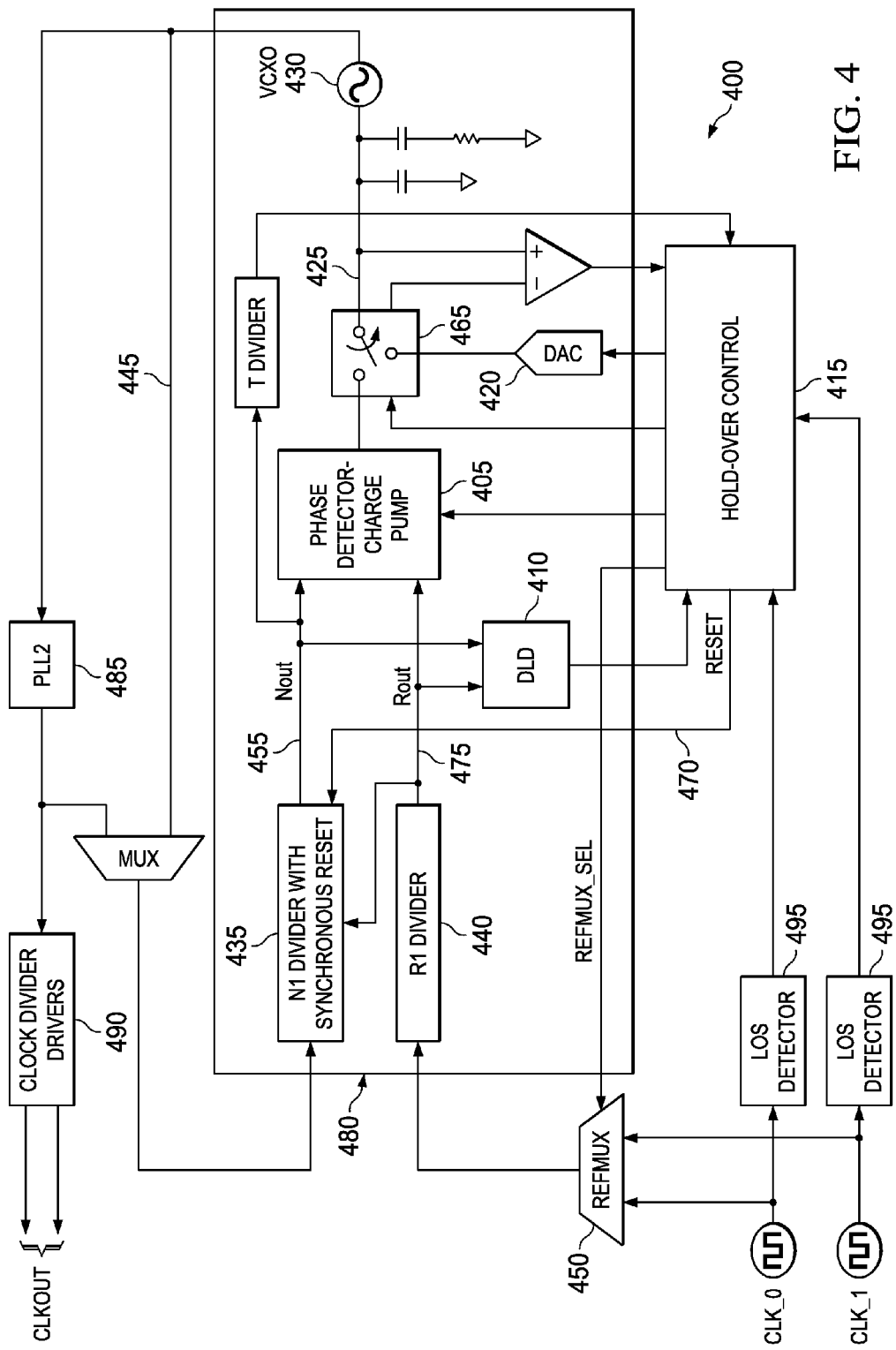

FIG. 4 is a more detailed schematic diagram depicting certain components of a timing circuit for a clock conditioner according to another aspect of the Application.

Figure 5:
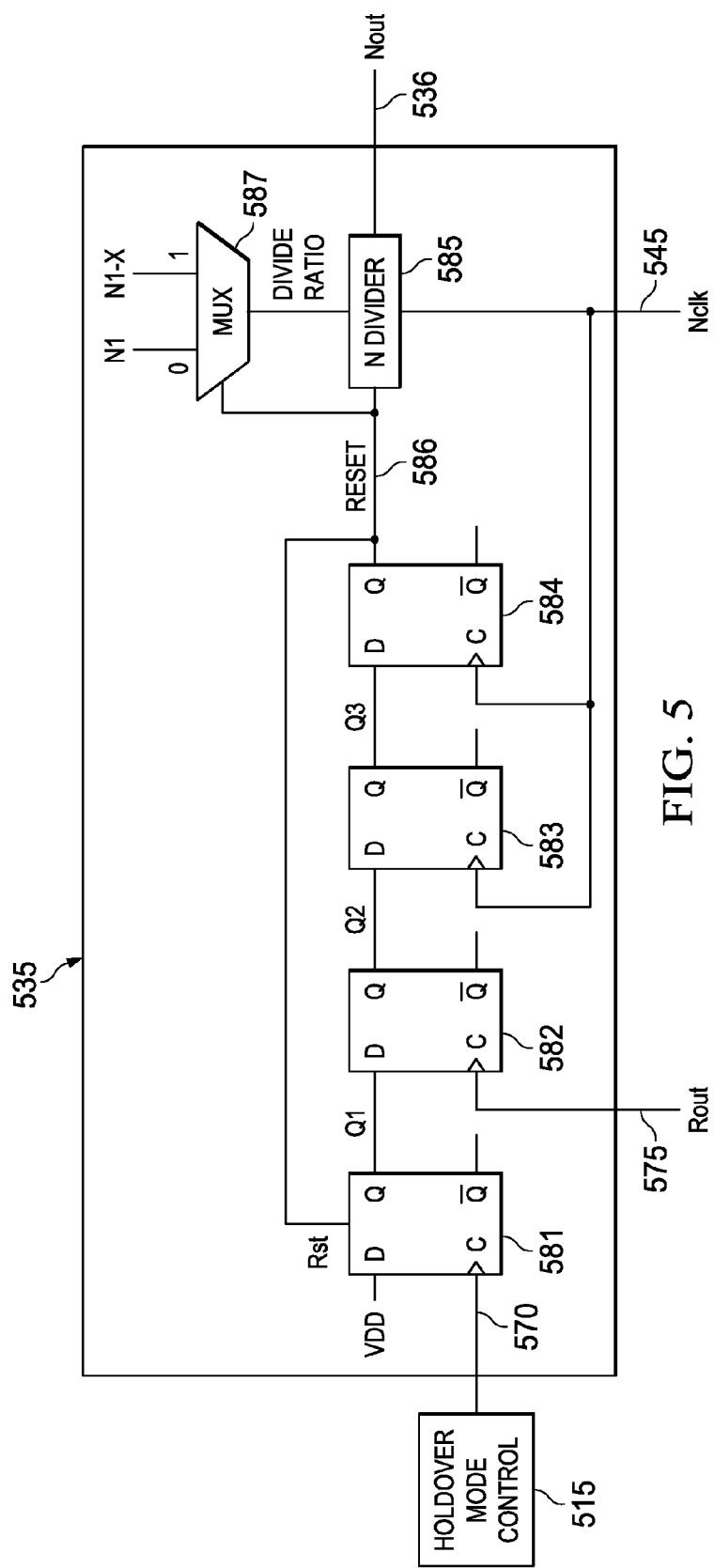

FIG. 5 is a schematic diagram of a portion of a timing circuit for a clock conditioner according to another aspect of the Application.

Figure 6:
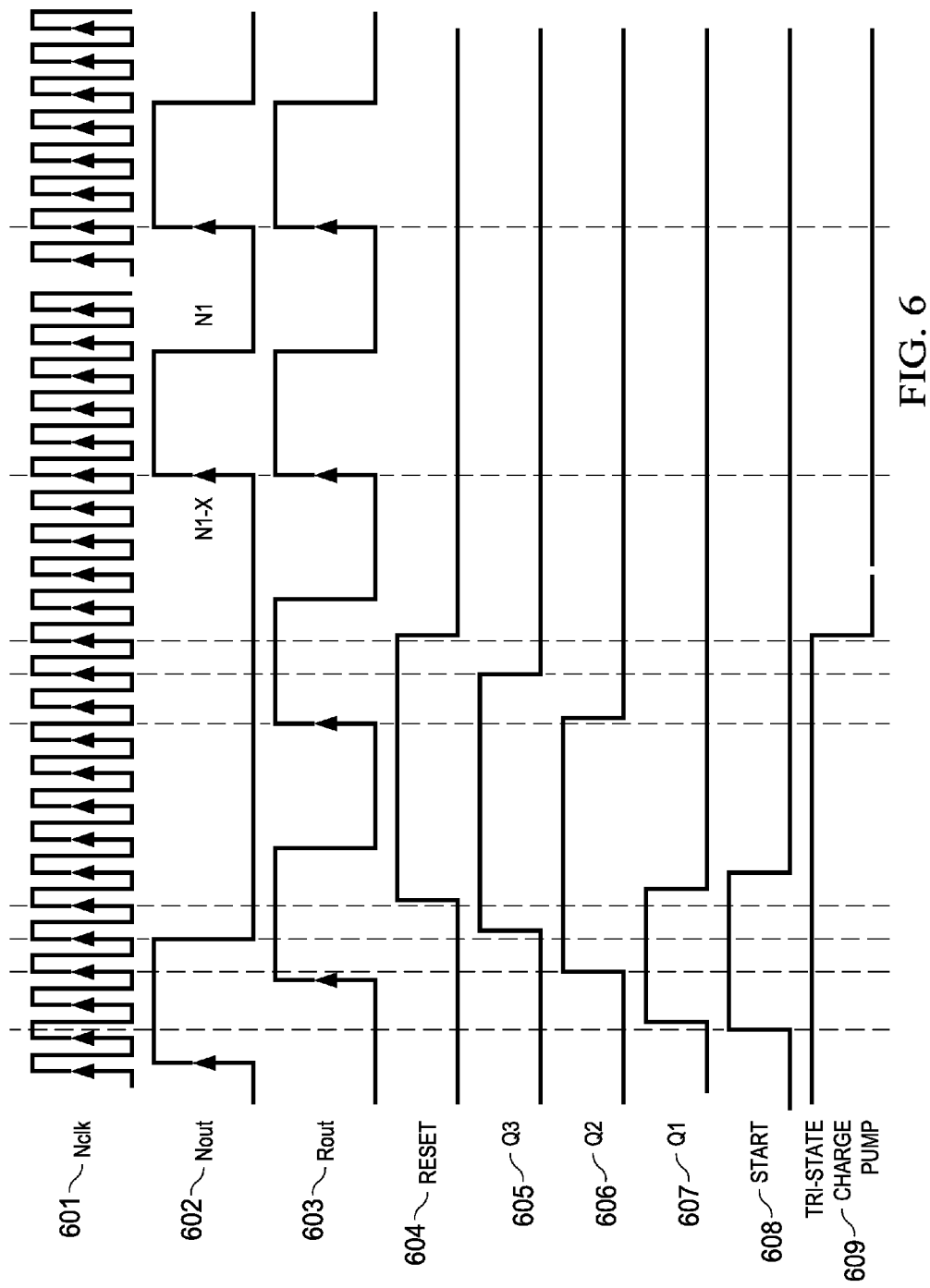

FIG. 6 is a waveform diagram illustrating the operation of a timing circuit for a clock conditioner according to various aspects of the Application.

DETAILED DESCRIPTION

The invention now will be described more fully hereinafter with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art. One skilled in the art may be able to use the various embodiments of the invention.

FIG. 1 is a schematic diagram illustrating certain components of a conventional timing circuit that includes two input clocks and a holdover function. The timing circuit 100 of FIG. 1 includes a Phase Detector-Charge Pump (PD-CP) 105 with a voltage-controlled crystal oscillator (VCXO) 125. The PD-CP 105 utilizes a reference clock signal 130 that is received from a component external to the timing circuit 100. The PD-CP 105 utilizes a feedback signal 135 from the VCXO 125 to generate a control voltage that is used to tune the VCXO 125 frequency such that the frequency and/or phase of output clock signals is determined by the reference clock signal 130. The reference clock signal is 130 is selected from two or more available input clock signals. In the conventional timing circuit 100, MUX 150 is used to select either Clock 1 or Clock 2 as the reference clock signal 130.

During time periods where the reference clock signal 130 is a valid input to the timing circuit 100, the holdover function is inactive. While the holdover function is inactive, the control voltage generated by the PD-CP 105 is tracked by analog-to-digital converter (ADC) 110. The ADC 110 generates a digital code that represents the tracked control voltage. In some cases, the digital code may be based on a prior control voltage signal that has been identified and stored for use in a holdover function. The digital code, whether generated previously or based on a tracked control voltage signal, is received as an input by the digital-to-analog converter (DAC) 115.

If the reference clock signal 130 is lost or otherwise rendered unusable, the holdover function of the timing circuit 100 is activated. In holdover mode, the DAC 115 uses the digital code to generate a holdover control voltage signal that is used in place of the control voltage output of the PD-CP 105, which may be disabled upon entering holdover mode, in certain embodiments, by tri-stating the charge pump of PD-CP 105. Holdover mode is initiated by the receipt of a control signal by switch 140 that connects the holdover control voltage to the control voltage input of the VCXO 125. Using this holdover control voltage, the VCXO 125 generates a holdover clock signal, which can be frequency-multiplied or divided to generate an output clock signal. A holdover function implemented in this manner is capable of providing reasonably accurate output clock signals during periods when the reference clock signal 130 is unavailable.

The timing circuit 100 exits the holdover function once the reference clock signal 130 becomes available. The reference clock signal 130 is validated by digital lock detector (DLD) 145. Validation of the reference clock signal 130 may instead be provided utilizing components such as a FPGA or a frequency error detector and may utilize additional support circuitry within the timing circuit 100. Once it has been determined that the reference clock signal can be used by a PLL, it is desirable for a timing circuit to exit holdover mode as quickly as possible while minimizing disturbances to the PLL, thus reducing transient frequency and phase errors in the output clock during the transition.

As discussed above, when transitioning from holdover mode back to normal operation mode, large phase differences at phase detector of PD-CP 105 may cause large transient phase and frequency errors in the output clock and may result in uncertain relock times that may be prohibitively long. In the conventional timing circuit 100 of FIG. 1, a large phase difference at the PLL is resolved by waiting for phase alignment of the reference clock signal 130 and the feedback signal 135 before signaling an exit to holdover mode. An issue with this conventional approach is the uncertain and potentially long delay that may result when exiting holdover mode under certain conditions. As discussed above, in situations where the frequency difference is small but the phase difference is large between the reference counter signal and the feedback counter signal inputs to the phase detector of the PD-CP 105, phase alignment of these two signals may be significantly delayed since there will be a slow rate of change in phase difference between the two signals. Thus, the time required to exit holdover under such conditions may be prohibitively long.

A delay in exiting holdover mode may have several negative consequences. First, delays in exiting holdover may result in a failure to adhere to a maximum time allowed for exiting holdover in some systems, which may require both a short exit-holdover time and minimal transient phase and frequency errors during transition. Second, in certain conventional timing circuits that are configured to automatically enter or exit holdover mode based on the frequency of the reference clock, a delay in exiting holdover may result in missed opportunities for the output clock to be locked to the reference clock.

For instance, in the scenario of FIG. 2, a timing circuit is configured to automatically enter into a holdover mode when the reference clock frequency is outside of a specified upper frequency limit 220 or lower frequency limit 230 that is being enforced by the timing circuit. Likewise, if the timing circuit is operating in holdover mode and the reference clock frequency is determined to be within the upper and lower frequency limits, the timing circuit will automatically exit holdover mode. However, in scenarios where the reference clock frequency is unstable, delays in exiting holdover may result in the timing circuit being unable to exit holdover mode.

In FIG. 2 for instance, the VCXO output tracks the reference signal and automatically enters holdover mode when the frequency of the reference signal surpasses the upper frequency limit 220. When the reference frequency drops below the upper frequency limit 220, the timing circuit is able to exit holdover within a window 205 that allows the timing circuit to lock onto the slowing reference signal. The VCXO continues to track reference signal until the frequency of the reference signal drops below the lower frequency limit 230, at which point the timing circuit reenters holdover mode. When the frequency of the reference signal increases such that it surpasses the lower frequency limit 230, the timing circuit attempts to automatically exit holdover mode. However, delays in exiting holdover lengthen the transition window 210 and may result in the timing circuit being unable to lock on to the reference signal, which is now increasing in frequency. In such circumstance, the timing circuit may remain stuck in holdover mode, in some cases until the next transition triggering automatic holdover exit by the timing circuit.

According to various aspects of the Application, the claimed invention provides the ability to quickly exit holdover while minimizing disturbances to the PLL and resulting transient frequency and phase errors in the PLL output by proactively aligning the phase of the feedback counter and reference counter inputs to the PLL phase detector. According to various aspects of the Application, this alignment of the phase detector inputs may be triggered by an exit-holdover command issued by an external component such as a FPGA or CPU, or triggered by detection of an exit-holdover condition by the frequency comparator and control circuitry of the PLL.

According to one aspect of the Application, FIG. 3 illustrates a clock conditioner 300 that utilizes a frequency comparator and control circuit for detecting certain exit-holdover conditions during holdover mode. During normal operations, the clock conditioner 300 utilizes a Phase Detector-Charge Pump (PD-CP) 305 to generate a control voltage 345 that determines the frequency of the output clock signal generated by VCXO 325. The control voltage 345 is sampled by an ADC 310, which generates a digital code that represents the control voltage. The digital code is received as an input by the DAC 315. During holdover mode, control voltage 345 is generated by the DAC 315 based on the digital code. In certain embodiments, the digital code utilized by DAC 315 to generate the control voltage 345 is generated and stored previously based on a representative control voltage signal that has been identified for use in a holdover function.

In holdover mode, the frequency comparator and control circuit 335 receives the input clock signal 330 and the holdover clock signal 350 generated by the VCXO 325. The frequency comparator and control circuit 335 monitors the frequency of input clock signal 330 using the VCXO holdover clock signal 350 as a reference clock. If the frequency of input clock 330 is determined to be within a specified frequency range, the frequency comparator and control circuit 335 issues an exit-holdover signal, thus initiating the exit from holdover mode by the clock conditioner 300.

FIG. 4 illustrates a clock conditioner 400 that provides improved holdover exit performance, according to another aspect of the Application. The clock conditioner 400 includes a PLL 480 that generates a control signal 425 that is used to tune a VCXO 430 such that it generates a clock signal that has a frequency and phase determined by the control signal. In certain aspects of the Application, such as clock conditioner 400, the clock signal generated by the VCXO 430 may be multiplied using another PLL 485 and divided using clock dividers 490 in order to generate an output clock signal, CLKOUT, for use by external components.

In the clock conditioner 400 of FIG. 4, a selected reference clock signal 450 is divided by reference divider 440 to generate the reference clock signal 475. The reference clock signal 475 is one of two inputs to the phase detector-charge pump (PD-CP) 405 of PLL 480. The other input to the PD-CP 405 is a divided feedback clock signal 455, which is divided from feedback signal 445 generated by VCXO 430. Under certain conditions, the feedback signal 455 input to phase detector/charge pump 405 is generated by another PLL which uses the feedback signal 445 generated by VCXO 430 as its reference signal. Once PLL 480 is locked, the frequency of VCXO 430 is tuned to the frequency of the reference clock signal 475.

In the clock conditioner 400 of FIG. 4, a holdover controller 415 is used to determine when to enter into holdover mode, when to exit holdover mode, and the timing sequence to be used in exiting holdover. Holdover mode is initiated upon a determination that no reference clock signal is presently available. In FIG. 4, two possible clocks, CLK_0 and CLK_1 are provided as inputs. Different variations in the number and type of available reference clocks are possible. In the clock conditioner 400, a reference clock is selected from two input clock signals, CLK_0 and CLK_1. Holdover mode may be initiated when both input clocks are unusable either due to signal loss or due to deterioration in a signal rendering it unreliable as a clock signal. These conditions are detected by one or more loss-of-signal (LOS) detectors 495 that each monitors one of the available clock signal inputs. Other embodiments may utilize frequency range detectors to determine the availability of the clock signal inputs, CLK_0 and CLK_1.

The LOS detectors 495 provide detection information to the holdover controller 415, the detection information describing the availability and/or quality of the available clocks. Based on the provided detection information, the holdover controller 415 determines whether the condition of the available clocks, CLK_0 and CLK_1, warrants switching to holdover mode. Holdover mode can also be initiated based on input provided by components external to the clock conditioner 400 such as a FPGA or CPU. Many additional variations are possible with regard to the conditions under which holdover mode may be activated by the holdover controller 415.

Once holdover mode has been activated, the holdover controller 415 issues a signal to deactivate the PD-CP 405, such as by tri-stating the charge pump of PD-CP 405, and also issues a signal to switch 465 that disconnects the control voltage output of PD-CP 405 and connects the holdover control voltage output generated by DAC 420. During holdover mode, DAC 420 is driven by a digital code representing a holdover control voltage signal. The DAC 420 output provides a stable and accurate tuning voltage for driving VCXO 430 during holdover mode, thus allowing the VCXO 430 to provide output clocks that maintain reasonably stable and accurate clock frequencies during holdover mode. Other aspects of the Application may utilize other mechanisms for providing DAC 420 with a digital code that can be used to generate a holdover control voltage signal. Certain aspects may utilize other mechanisms besides or in addition to a DAC in generating a holdover control voltage signal.

As discussed above, exit-holdover can be triggered by an external component such as a FPGA or CPU, or by detection of an exit-holdover condition by the frequency comparator and control circuitry of the clock conditioner 400. For the example embodiment of clock conditioner 400, the frequency comparator and control circuitry consists of the holdover controller 415, the LOS detectors 455, and the digital lock detector (DLD) 410. This circuitry can be used to automatically detect when exit-holdover conditions are met such that the phase of the feedback counter input 455 to the PD-CP 405 can be aligned to the reference counter input 475.

To automatically detect that an exit-holdover condition is met during holdover in clock conditioner 400, the LOS detectors 495 are configured to continuously monitor the available clock signals, CLK_0 and CLK_1. Based on this monitoring, the holdover controller 415 is configured to evaluate the suitability of the available clock signals for use as a reference clock signal. The holdover controller 415 is further configured to issue commands to MUX 450 to select the most suitable of the available clock signals, CLK_0 or CLK_1, as a reference clock signal 475.

If one of the available input signals is determined to be suitable as a clock signal, the holdover controller 415 initiates a frequency comparison cycle to determine whether the input clock signal frequency is within a specified frequency range tolerance. A frequency comparison cycle triggers the operation of the DLD 410 in determining whether the divided feedback clock signal 455 and the target reference clock signal 475 are sufficiently close with respect to frequency such that holdover can be exited.

Once a frequency comparison cycle has been initiated, the DLD 410 compares sampled signals from the target reference clock signal 475 and the divided feedback clock signal 455. The DLD 410 tracks the number of phase-aligned samples between the two signals during a frequency comparison cycle. If the number of phase-aligned samples that are identified is above a certain threshold, the DLD 410 determines that the frequencies of two inputs are sufficiently close and thus signals the holdover controller 415 of this condition. Based on this signal from the DLD 410, the holdover controller 415 signals the initiation of the exit holdover sequence. If an unacceptably low number of phase-aligned samples are encountered, the DLD 410 signals this condition to the holdover controller 415 and the present holdover operations continue until the next frequency comparison cycle starts.

For the example embodiment of clock conditioner 400 in which holdover transitions are based on phase comparison, one potential scenario that can slow down automatic frequency comparison is, if at beginning of a frequency comparison cycle, the frequencies of two inputs provided to the DLD are relatively closely matched, but their phase difference is large. In this case, it may take a long time before DLD can detect phase-aligned samples, thus delaying exit from holdover mode. To solve this issue, a technique is disclosed by which feedback divider 435 is reset synchronously with the reference clock signal 475 to proactively align the phase of the outputs generated by feedback divider 435 and reference divider 440 at the beginning of a frequency comparison cycle. This synchronous reset serves to minimize the phase difference between the divided feedback clock signal 455 and the target reference clock signal 475 at the beginning of each frequency comparison cycle such that the DLD 410 is able to quickly detect whether the frequency of the reference clock signal 475 is within a specified frequency range such that the exit holdover sequence can be initiated.

In clock conditioner 400, the feedback divider output 435 is synchronously aligned with the reference divider 440 output 445 using a reset signal 470 generated by the holdover controller 415. In certain aspects of the Application, the reset signal 470 will be issued by the holdover controller 415 concurrently with the initiation of a frequency comparison cycle. At the beginning of a frequency comparison cycle, the error counter of DLD 410, which tracks the number of phase-aligned samples that are encountered during a frequency comparison cycle, is reset. By aligning the phases of the outputs of feedback divider 435 and reference divider 440 concurrent with the initiation of a new frequency comparison cycle, the clock conditioner 400 can minimize the time necessary to achieve a successful frequency comparison. This allows rapid detection of conditions for exiting holdover, especially in scenarios where there is a significant phase difference between the two input signals.

FIG. 5 is a block diagram illustrating certain components of the feedback divider 435 of FIG. 4, by which the feedback divider output 455 of the feedback divider is phase-aligned with the divided reference clock signal 475. FIG. 5 illustrates the generation of the feedback divider output 536 by components of the feedback divider 535. At the initiation of a frequency comparison cycle, the holdover controller 515 initiates phase alignment by switching reset signal 570 from low to high. Once the reset signal 570 is high, the output of flip-flop 581 becomes high. This output of flip-flop 581 is then sampled by flip-flop 582, triggered at the clock edge of the divided reference clock signal 575. The output of flip-flop 582, now sampled synchronously with the output of the reference divider, is re-sampled by flip-flops 583 and 584 based on the clock-edge of the feedback clock signal 545 provided as an Nclk inputs to the feedback divider 535. Once the reset signal 586 is high, it clears flip-flops 581, 582, 583 and 584. Thus, the falling edge of reset signal 586, which restarts N divider 585, is triggered by the rising edge of the divided reference clock signal 575 and then synchronized with the Nclk feedback clock signal 545.

If N1 is the divide ratio in the normal operation of N divider 585, the falling edge of a reset signal 586 reconfigures the inputs to N divider 585 by selecting the input of multiplexer 587 during the first divide cycle such that it operates with a divide ratio N1−X, where X is an adjustment to N divider 585 such that it aligns the phase of the feedback divider output 536 with the phase of the input feedback signal 545. In certain embodiments, X can be selected based on the restart latency of N divider 585. In this manner, the next rising edge of feedback divider output Nout 536 output is nearly phase aligned with the rising edge of the divided reference clock signal 575. The phase alignment error is expected to be within 1~2*Tclk, where Tclk is the period of the input feedback signal Nclk 545. In certain embodiments, the input feedback signal 545 may be divided in order to increase the frequency of the Nclk input and further reduce phase alignment error. For example, if using a 1 GHz clock signal for Nclk, the phase alignment error can be eliminated in less than 2 ns. Once the first divide cycle is completed, the multiplexer 587 selects divide ratio N1 to resume normal operation.

Referring also to FIG. 4, by phase-aligning the feedback divider output 536 synchronously with the divided reference clock signal 575 and triggering this phase-alignment process concurrent with the beginning of a frequency comparison cycle, the clock conditioner 400 provides the ability to quickly detect conditions where the DLD can automatically signal an end to holdover condition. The falling edge of the reset signal 570 issued by the holdover controller that is triggers phase alignment by the feedback divider 535 serves to trigger reactivation of the PLL phase detector-charge pump 405 and deactivation of the holdover clock signal generation by DAC 420. In this manner, the PLL 480 quickly resumes normal operation while minimizing the impact of phase differences between the reference clock signal 475/575 and the feedback clock signal 455/536 436/536. Clock conditioner 400 thus provides reduced PLL re-lock time and reduced transient frequency and phase errors in the generated output clocks.

FIG. 6 illustrates a set of waveforms generated using a clock conditioner such as described with respect to FIGS. 3-5. As illustrated in waveforms 601-609, a clock conditioner according to various embodiments may be configured to quickly phase-align the counters used as inputs to the PLL, thus enabling holdover mode to be exited quickly, even when the counter inputs are significantly out of phase.

Many modifications and other embodiments of the invention will come to mind to one skilled in the art to which this invention pertains having the benefit of the teachings presented in the foregoing descriptions, and the associated drawings. Therefore, it is to be understood that the invention is not to be limited to the specific embodiments disclosed. Although specific terms are employed herein, they are used in a generic and descriptive sense only and not for purposes of limitation.

What is claimed is:

1. A timing circuit comprising:
an oscillator control terminal;
an oscillator feedback terminal; and
at least one reference clock terminal;
a first divider coupled to the oscillator feedback input terminal, and operable to generate a first input signal based on an oscillator feedback signal received through the oscillator feedback terminal;
a second divider coupled to the reference clock terminal, and operable to generate a second input signal based on a reference clock signal received through the reference clock terminal;
PLL circuitry operable to generate an oscillator control signal for output through the oscillator control terminal, wherein the frequency of an oscillator clock signal based on the oscillator control signal corresponds to the frequency of the second input signal, and wherein the PLL generates the oscillator control signal based on the first input signal and the second input signal;
the PLL circuitry operable in a holdover mode to generate a holdover control signal for output through the oscillator control terminal, wherein the frequency of an oscillator holdover clock signal is based on the holdover control signal;
holdover circuitry operable to control the PLL circuitry to enter and exit the holdover mode, including, for holdover exit conditions, issuing a reset signal to the first divider, wherein the reset signal synchronizes the phase of the first input signal and the second input signal; and
a digital lock detector operable to detect holdover exit conditions based on the first input signal and the second input signal.

2. The timing circuit of claim 1, wherein the digital lock detector is further operable to detect holdover exit conditions based on a cycle of frequency comparisons between the first inputs signal and the second input signal.

3. The timing circuit of claim 2, wherein the holdover circuitry is further operable to issue the reset signal concurrent with the initiation of a frequency comparison cycle by the DLD.

4. The timing circuit of claim 1, further comprising:
a flip-flop operable to sample the reset signal.

5. The timing circuit of claim 4, wherein the flip-flop is further operable to sample the reset signal synchronously with the second input signal.

6. The timing circuit of claim 2, wherein the holdover circuitry is further operable to initiate a frequency comparison cycle by the DLD based on validation of the reference clock signal.

7. The timing circuit of claim 1, further comprising:
a digital to analog converter operable for generating the holdover control signal, wherein the holdover control signal is generated based on a digital code provided by the holdover controller.

8. A clock conditioner comprising:
an oscillator operable for generating a conditioned clock signal based on a control signal and further operable for generating a feedback clock signal, wherein the control signal is generated based on a reference clock signal;
a holdover controller operable for initiating a holdover mode based on a loss of the reference clock signal and further operable to exit the holdover mode by issuing a reset signal that synchronizes the phases of the feedback clock signal with the reference clock signal; and
a digital lock detector (DLD) operable to detect holdover exit conditions based on the feedback clock signal and the reference clock signal.

9. The clock conditioner of claim 8, wherein the holdover controller is further operable to signal the replacement of the control signal with the holdover control signal upon entering the holdover mode.

10. The clock conditioner of claim 9, wherein the holdover controller is further operable to initiate a frequency comparison cycle by the DLD based on validation of the reference clock signal.

11. The clock conditioner of claim 10, wherein the holdover controller is further operable to issue the reset signal concurrent with the initiation of a lock detection cycle.

12. A method for exiting a holdover mode of operation of a clock conditioner, the method comprising:
dividing a feedback clock signal using a first divider to generate a first input signal, wherein the feedback clock signal is generated by an oscillator;
dividing a reference clock signal to generate a second input signal;
generating a control signal for input to the oscillator to generate a clock signal, wherein the frequency of the clock signal corresponds to the frequency of the second input signal, and wherein the control signal is generated based on the first input signal and the second input signal;
initiating a holdover mode based on a loss of the reference clock signal, including generating a holdover control signal for input to the oscillator to generate a holdover clock signal, wherein the frequency of the holdover clock signal is based on the holdover control signal, and exiting the holdover mode by
issuing a reset signal to the first divider, wherein the reset signal synchronizes the phase of the first input signal and the second input signal; and
detecting conditions for exiting the holdover mode based on a frequency comparison cycle of the first input signal and the second input signal.

13. The method of claim 12, wherein the reset signal is provided concurrently with the initiation of a frequency comparison cycle.

14. The method of claim 12, further comprising:
generating a sample of the reset signal.

15. The method of claim 14, wherein the reset signal is sampled synchronously with the second input signal.

16. The method of claim 12, further comprising:
initiating a frequency comparison cycle based on validation of the reference clock signal.

17. The method of claim 16, further comprising:
generating the holdover control signal based on a digital code.

* * * * *